(12) United States Patent
Umeda et al.

(10) Patent No.: US 11,289,313 B2
(45) Date of Patent: Mar. 29, 2022

(54) PLASMA PROCESSING APPARATUS

(71) Applicant: HITACHI HIGH-TECH CORPORATION, Tokyo (JP)

(72) Inventors: Shota Umeda, Tokyo (JP); Keita Nogi, Tokyo (JP); Akira Kagoshima, Tokyo (JP); Daisuke Shiraishi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/123,208

(22) Filed: Sep. 6, 2018

(65) Prior Publication Data
US 2019/0221407 A1    Jul. 18, 2019

(30) Foreign Application Priority Data

Jan. 17, 2018  (JP) ............................. JP2018-005761

(51) Int. Cl.
*H01J 37/32* (2006.01)
*H01L 21/67* (2006.01)
*G01J 3/443* (2006.01)
*G05B 19/418* (2006.01)

(52) U.S. Cl.
CPC ......... *H01J 37/32926* (2013.01); *G01J 3/443* (2013.01); *G05B 19/41875* (2013.01); *H01J 37/32972* (2013.01); *H01L 21/67253* (2013.01); *G05B 2219/2602* (2013.01)

(58) Field of Classification Search
None
See application file for complete search history.

(56) References Cited

U.S. PATENT DOCUMENTS

| | | | |
|---|---|---|---|
| 7,908,025 B2 | 3/2011 | Miwa et al. | |
| 8,992,721 B2* | 3/2015 | Kagoshima | H01J 37/32926 156/345.24 |
| 2004/0181299 A1 | 9/2004 | Yamazaki et al. | |
| 2009/0026172 A1 | 1/2009 | Kitabata et al. | |
| 2016/0020123 A1 | 1/2016 | Asakura et al. | |
| 2016/0225681 A1 | 8/2016 | Asakura et al. | |

(Continued)

FOREIGN PATENT DOCUMENTS

| | | |
|---|---|---|
| JP | 2004281461 A | 10/2004 |
| JP | 20040335841 A | 11/2004 |

(Continued)

OTHER PUBLICATIONS

Office Action dated Jul. 21, 2019 in Korean Application No. 10-2018-0083797.

(Continued)

*Primary Examiner* — Sean Shechtman
(74) *Attorney, Agent, or Firm* — Miles & Stockbridge, P.C.

(57) ABSTRACT

Provided is a plasma processing apparatus including a processing unit in which a sample is plasma processed and which includes a monitor (optical emission spectroscopy) that monitors light emission of plasma, wherein the processing unit includes a prediction model storage unit that stores a prediction model predicting a plasma processing result, and a control device in which the plasma processing result is predicted by using a prediction model selected based on light emission data and device data as an indicator of state change of the processing unit.

8 Claims, 10 Drawing Sheets

(56) References Cited

U.S. PATENT DOCUMENTS

2016/0379896 A1* 12/2016 Asakura ............ H01J 37/32972
　　　　　　　　　　　　　　　　　　　　156/345.24
2019/0170653 A1　　6/2019 Asakura et al.

FOREIGN PATENT DOCUMENTS

| JP | 2005051269 A | 2/2005 |
|----|--------------|--------|
| JP | 200949382 A | 3/2009 |
| JP | 2016-25145 A | 2/2016 |
| KR | 2016-0094251 A | 8/2016 |
| TW | 201515095 A | 4/2015 |
| TW | 201724157 A | 7/2017 |
| TW | 210742101 | 12/2017 |
| WO | 2007066404 A1 | 6/2007 |

OTHER PUBLICATIONS

Runze Li et al. "Variable Selection via Partial Correlation." St. Atistica Sinca, Jul. 2017, vol. 3, Issue 3, pp. 983-996.
Office Action dated Dec. 25, 2019 in Taiwanese Application No. 107127210.
Office Action dated Jul. 20, 2021 in Japanese Application No. 2018-005761.

* cited by examiner

PREDICTION MODEL TABLE 16a

| PREDICTION MODEL ID | EXPLANATORY VARIABLE | CALCULATION FORMULA |
|---|---|---|
| PREDICTION MODEL 1 | x3, x5 | 0.12 + 0.32 * x3 + 0.15 * x5 |
| PREDICTION MODEL 2 | X2, x3, X7 | 0.16 + 0.22 * X2 + 0.25 * x3 + 0.18 * X7 |
| ... | ... | ... |

FIG. 4

PREDICTION MODEL SWITCHING CONDITION TABLE 17a

| SWITCHING MONITOR VARIABLE 17b | PREDICTION MODEL ID 17c | PARTIAL CORRELATION 17d |
|---|---|---|
| x3, x5, X2, X7 | PREDICTION MODEL 1 | <table><tr><td></td><td>x3</td><td>x5</td><td>X2</td><td>X7</td></tr><tr><td>x3</td><td></td><td>0.5</td><td>0</td><td>0</td></tr><tr><td>x5</td><td>0.5</td><td></td><td>0</td><td>0</td></tr><tr><td>X2</td><td>0</td><td>0</td><td></td><td>0</td></tr><tr><td>X7</td><td>0</td><td>0</td><td>0</td><td></td></tr></table> |
| | PREDICTION MODEL 2 | <table><tr><td></td><td>x3</td><td>x5</td><td>X2</td><td>X7</td></tr><tr><td>x3</td><td></td><td>0</td><td>0.3</td><td>0.1</td></tr><tr><td>x5</td><td>0</td><td></td><td>0</td><td>0</td></tr><tr><td>X2</td><td>0.3</td><td>0</td><td></td><td>0.2</td></tr><tr><td>X7</td><td>0.1</td><td>0</td><td>0.2</td><td></td></tr></table> |
| | ... | ... |

FIG. 5

SETTING APC

PLEASE SET PREDICTION MODEL
TO PERFORM APC AND INSTRUCT EXECUTION

PREDICTION MODEL SWITCHING CONDITION (D101)

| SWITCHING MONITOR VARIABLE | PREDICTION MODEL ID | PARTIAL CORRELATION |
|---|---|---|
| x3, x5, X2, X7 | PREDICTION MODEL 1 | |       | x3  | x5  | X2 | X7 |<br>| x3 | \   | 0.5 | 0  | 0  |<br>| x5 | 0.5 | \   | 0  | 0  |<br>| X2 | 0   | 0   | \  | 0  |<br>| X7 | 0   | 0   | 0  | \  | |
|  | PREDICTION MODEL 2 | |    | x3  | x5 | X2  | X7  |<br>| x3 | \   | 0  | 0.3 | 0.1 |<br>| x5 | 0   | \  | 0   | 0   |<br>| X2 | 0.3 | 0  | \   | 0.2 |<br>| X7 | 0.1 | 0  | 0.2 | \   | |

PREDICTION MODEL (D102)

| PREDICTION MODEL ID | EXPLANATORY VARIABLE | CALCULATION FORMULA |
|---|---|---|
| PREDICTION MODEL 1 | x3, x5 | $0.12 + 0.32 * x3 + 0.15 * x5$ |
| PREDICTION MODEL 2 | X2, x3, X7 | $0.16 + 0.22 * X2 + 0.25 * x3 + 0.18 * X7$ |

D103 — PREDICTION EXECUTION: Yes / No

D104 — APC EXECUTION: Yes / No

FIG. 6
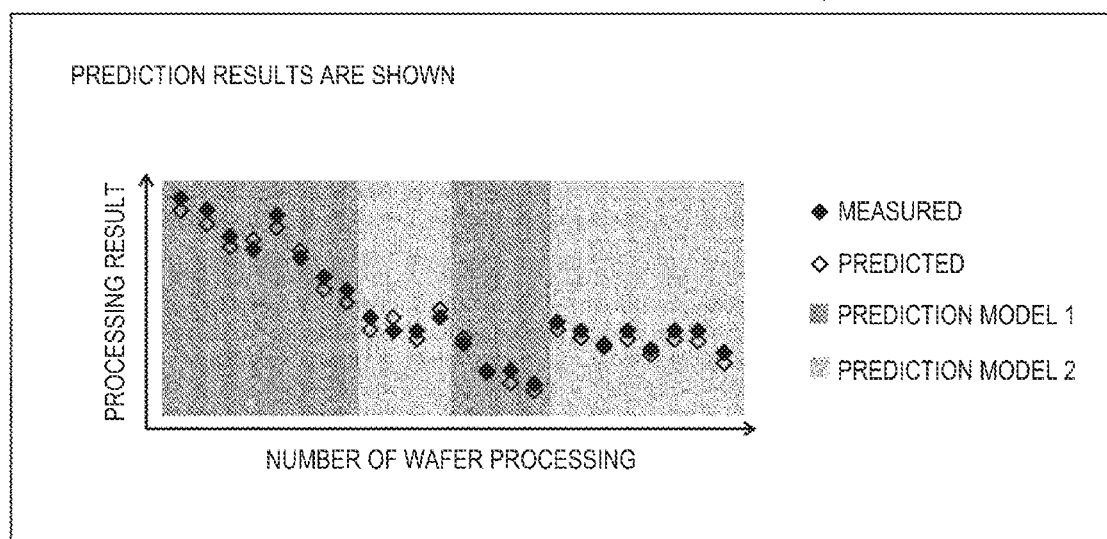
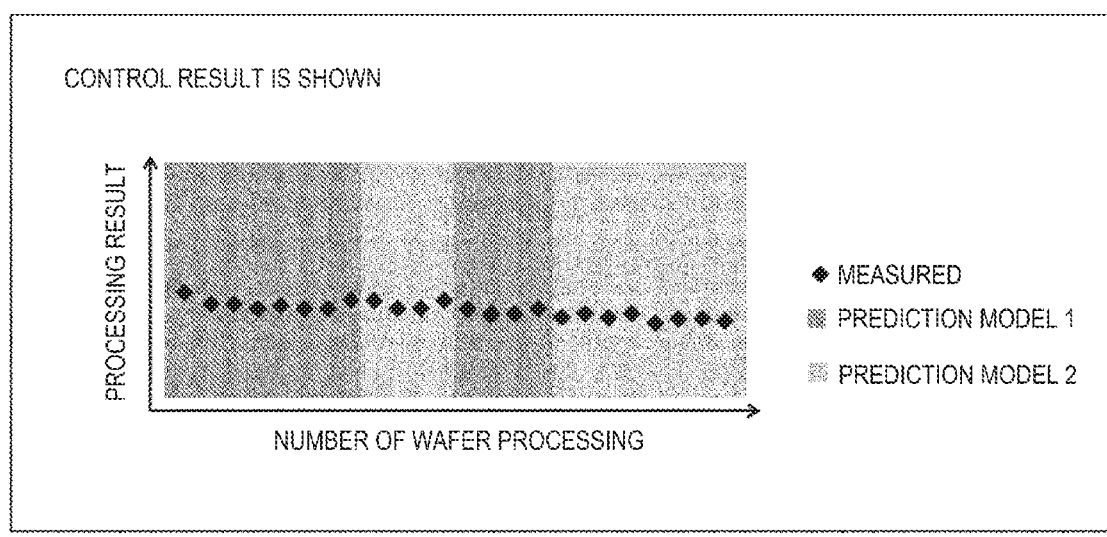

FIG. 7

| WAFER ID | LIGHT EMISSION DATA | | | DEVICE DATA | | | | PROCESSING RESULT |
|---|---|---|---|---|---|---|---|---|
| | x1 | ... | xk | X1 | X2 | ... | Xn | |
| W1 | 80.6 | ... | 79.0 | 102 | L1 | ... | 35 | 1.8 |
| W2 | 79.5 | ... | 79.4 | 130 | L1 | ... | 48 | 1.9 |
| ... | ... | ... | ... | ... | ... | ... | ... | ... |
| W480 | 81.5 | ... | 80.5 | 201 | L20 | ... | 92 | 2.5 |

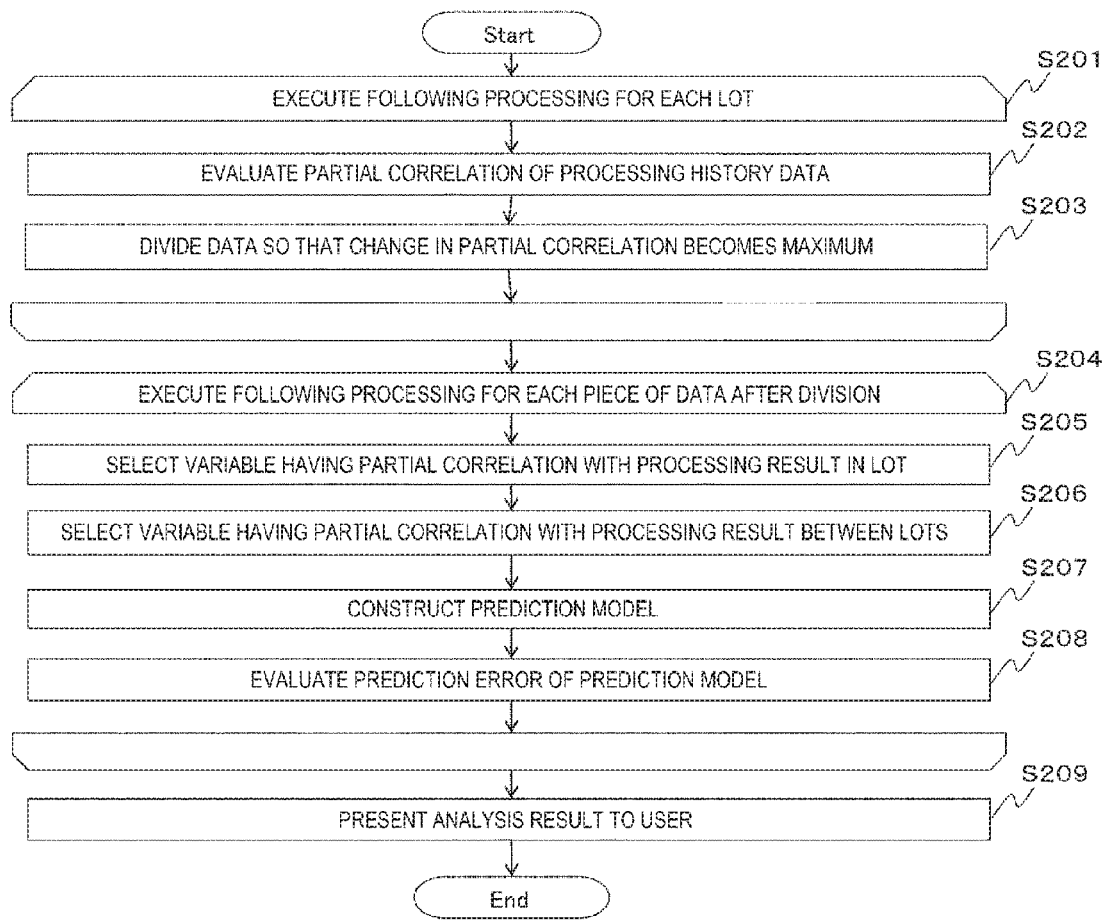

PLEASE DESIGNATE LIGHT EMISSION DATA AND DEVICE DATA TO BE USED FOR ANALYSIS
AND PLEASE CLICK EXECUTION BUTTON FOR ANALYSIS PROCESSING

DESIGNATING LIGHT EMISSION DATA

PLEASE DESIGNATE LIGHT EMISSION
DATA AS CANDIDATE
FOR EXPLANATORY VARIABLE

D401

| OES DATA |
|---|
| ☑ x1 |
| ☑ x2 |
| ☑ x3 |

DESIGNATING DEVICE DATA

PLEASE DESIGNATE DEVICE DATA
AS CANDIDATE
FOR EXPLANATORY VARIABLE

D402

| DEVICE DATA |
|---|
| ☑ X1 |
| ☑ X2 |
| ☐ X3 |

D403

EXECUTE

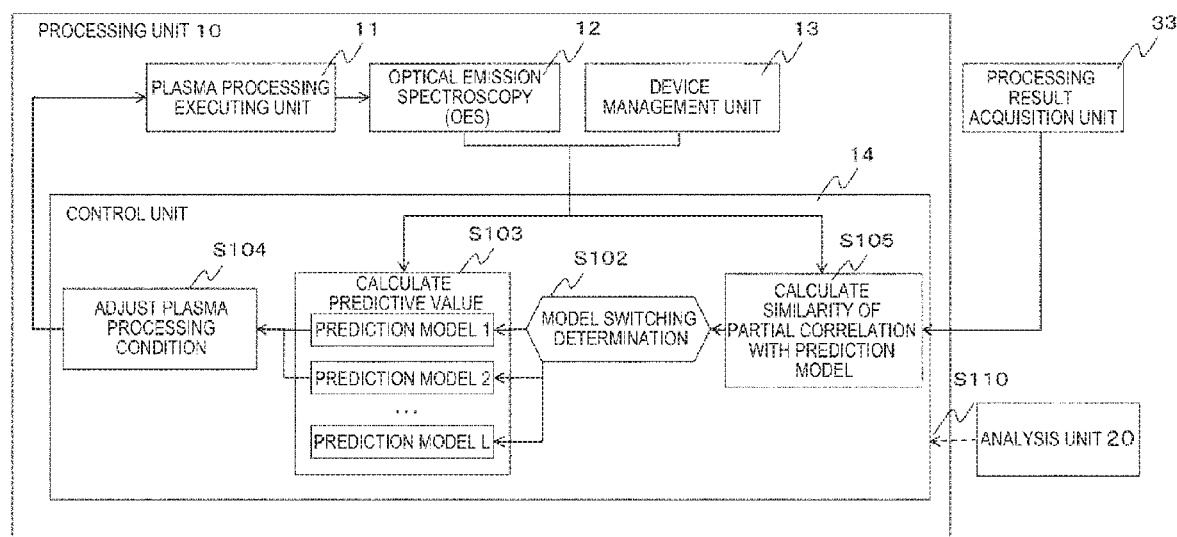

FIG. 11A

PLASMA PROCESSING APPARATUS

BACKGROUND OF THE INVENTION

1. Field of the Invention

The present invention relates to a plasma processing apparatus.

2. Description of Related Art

In order to form a fine shape on a semiconductor wafer, plasma processing in which a substance is caused to be in a plasma state and using an action of this substance (reaction on a wafer surface), a substance on the wafer is removed is performed.

As a control technology of adjusting a plasma processing condition, advanced process control (APC) is adopted in order to stabilize a processing result of the plasma processing, such as a dimension of the fine shape.

In the APC, the processing result is predicted by using apparatus monitoring data measured during the plasma processing in a plasma processing apparatus, and the plasma processing condition of the wafer or lot to be subsequently processed is adjusted according to the prediction. Here, the "lot" refers to a construction unit formed by bundling a plurality of wafers which are continuously subjected to plasma processing.

Since the plasma processing is accompanied by light emission, optical emission spectroscopy (OES) is mounted on the plasma processing apparatus. Data measured by the optical emission spectroscopy (hereinafter, referred to as light emission data) or the like are used as the monitoring data.

JP-A-2016-25145 discloses a method in which, a light emission wavelength with a small prediction error of processing dimension is selected among a large number of light emission wavelengths of the light emission data to predict and control the processing dimension.

In JP-A-2016-25145, the processing result is predicted by using a prediction model which is a single function in which the light emission data is used as an input and a predictive value of the processing result is used as an output.

However, in JP-A-2016-25145, since the single prediction model is used, in a case where a state of the apparatus changes by superimposing the plasma processing and a correlation between the light emission data and the processing result changes, it is not possible to cope with the change of the correlation and prediction accuracy decreases.

SUMMARY OF THE INVENTION

The present invention is to predict a processing result with high accuracy corresponding to the change of the state of the plasma processing apparatus.

According to an aspect of the present invention, a plasma processing apparatus includes a processing unit in which a sample is plasma processed and which includes a monitor that monitors light emission of plasma, wherein the processing unit includes a prediction model storage unit that stores a prediction model predicting a plasma processing result, and a control device configured to predict the plasma processing result by using a prediction model selected based on light emission data and device data as an indicator of state change of the processing unit.

According to another aspect of the present invention, a plasma processing apparatus includes a processing unit in which a sample is plasma processed and which includes a prediction model storage unit that stores a prediction model predicting a plasma processing result, wherein the plasma processing apparatus further includes an analysis unit that constructs the prediction model by using an explanatory variable selected based on a partial correlation between the plasma processing result and an explanatory variable of the prediction model.

According to the aspects of the present invention, it is possible to predict a processing result with high accuracy corresponding to the change of the state of the plasma processing apparatus.

BRIEF DESCRIPTION OF THE DRAWINGS

FIG. 4 is a diagram showing an example of data stored in a prediction model switching condition storage area;

FIG. 5 is a diagram showing an example of a setting screen of an advanced process control (APC);

FIG. 6 is a diagram showing an example of a display screen of a prediction and control result obtained by the APC;

FIG. 7 is a diagram showing an example of data stored in a processing history storage area;

FIG. 9 is a diagram showing analysis processing using the processing history data of the analysis unit;

FIG. 10 is a diagram showing an example of a screen for designating input of analysis processing of the analysis unit;

FIG. 11A is a configuration diagram illustrating the prediction and control processing.

DESCRIPTION OF THE EMBODIMENTS

First, an embodiment will be described.

In the embodiment, a prediction model used for a wafer or a lot to be subsequently processed is switched based on a correlation between monitoring data in a plurality of wafers processed at the time of APC execution (For example, a lot before a lot to be subsequently processed).

In addition, in the embodiment, plural pieces of monitoring data are used as an input of a prediction model (hereinafter, referred to as an explanatory variable). When constructing a prediction model with a single explanatory variable, for example, in a case where plural pieces of monitoring data affect a processing result, prediction accuracy decreases. Therefore, the prediction model is constructed using a plurality of variables.

In this case, when selecting monitoring data with a low direct correlation with the processing result as the explanatory variable of the prediction model, prediction accuracy may deteriorate. In order to prevent this inappropriate variable from being selected, an explanatory variable suitable for prediction is selected from among multiple monitoring data.

In addition, in the embodiment, when constructing the prediction model, an analysis is performed in consideration of variation in a lot. Since there are many cases where a tendency of the variation of the processing result in the lot is different from the tendency of the variation of the processing result between the lots, there is a possibility that prediction model with low prediction accuracy is constructed without capturing an influence of variations in the lot. Therefore, in the embodiment, a multivariate prediction model with high prediction accuracy is constructed by selecting an explanatory variable considering variations in the lot and partial correlation from plural pieces of monitoring data.

According to the embodiment, in the plasma processing apparatus, even in a case where the correlation between monitor data and processing result changes, the prediction models are switched according to an apparatus state at the time of APC execution, and the processing result is predicted to perform a control. In addition, even in a case where there are plural pieces of monitor data, the explanatory variable suitable for prediction is selected to construct the prediction model.

Hereinafter, Example will be described using the drawings.

Example (1) Plasma Processing Apparatus

A configuration of the plasma processing apparatus will be described with reference to FIG. 1.

Figure 1:
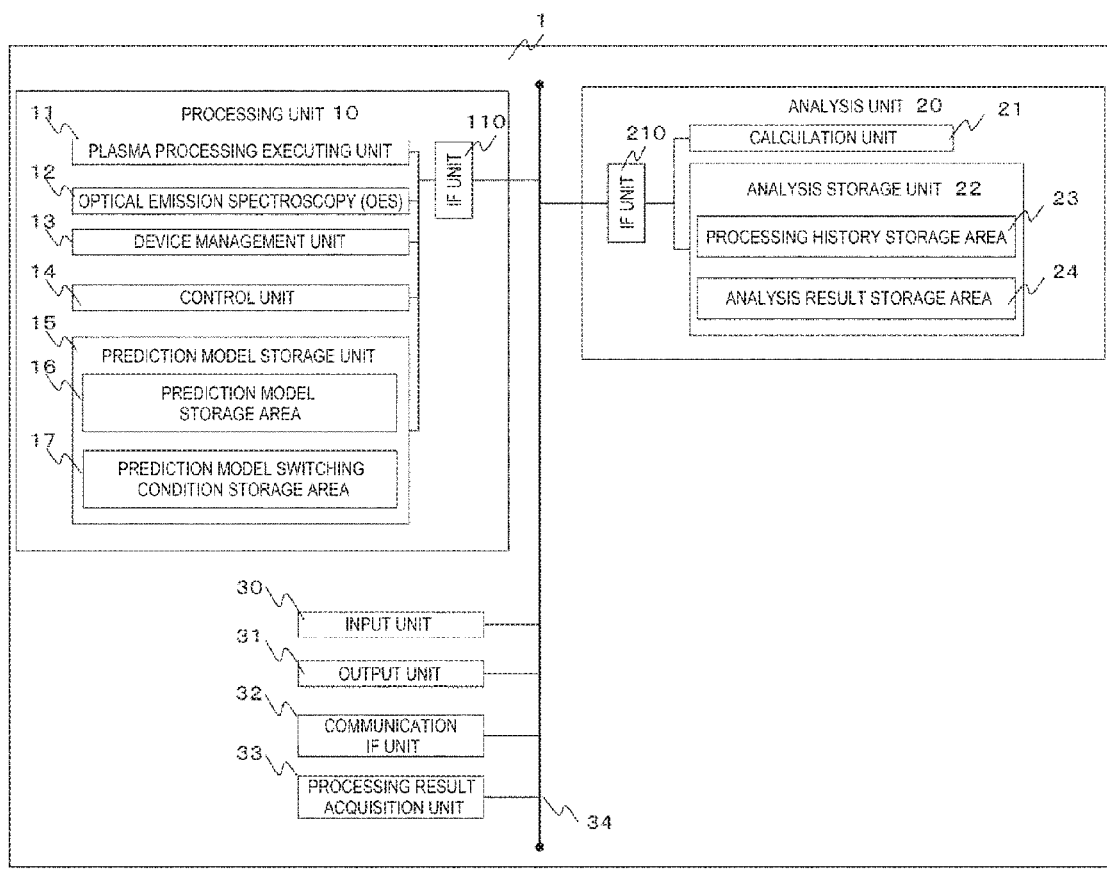
FIG. 1 is a configuration diagram of a plasma processing apparatus of Example.

As shown in FIG. 1, a plasma processing apparatus 1 includes a processing unit 10, an analysis unit 20, an input unit 30, an output unit 31, a communication interface unit 32 (communication IF unit), and a processing result acquisition unit 33, which are mutually connected via a bus 34.

The processing unit 10 includes a plasma processing executing unit 11, an optical emission spectroscopy (OES) 12, a device management unit 13, a control device 14, a prediction model storage unit 15, and an interface (IF) unit 110. The plasma processing executing unit 11 generates plasma to process a wafer. The optical emission spectroscopy 12 acquires light emission data during plasma processing. In addition, in the present Example, the optical emission spectroscopy 12 is used, but as long as a unit can monitor plasma light emission, monitors such as polychromator, monochromator, and a filter may also be used as a substitute for the optical emission spectroscopy 12. The light emission data is stored in an analysis storage unit 22 of the analysis unit 20 via an IF unit 210.

The device management unit 13 measures and stores data of the plasma processing executing unit 11, such as the number of wafers which are plasma processed from wet cleaning, wait time, and set value and processing value of a processing condition. Values of these data will be referred to as device data. The device data is stored in the analysis storage unit 22 of the analysis unit 20 via the IF unit 210.

The control device 14 performs a prediction and control processing that predicts the processing result of the plasma processing by using the prediction model stored in the prediction model storage unit 15 to adjust the plasma processing condition. Here, the processing result of the plasma processing refers to, for example, a dimension of a fine shape on the wafer after plasma processing and a processing speed at which the fine shape is processed by the plasma processing apparatus.

Details of the control device 14 will be described in the following (2).

The prediction model storage unit 15 includes a prediction model storage area 16 and a prediction model switching condition storage area 17. The prediction model storage area 16 stores a prediction model in which the light emission data or the device data constructed using the processing history data in the analysis unit 20 is used as an input and the predictive value of the processing result is used as an output.

In the plasma processing apparatus 1 of Example, in order to make switching of the prediction models possible, a plurality of prediction models can be stored. The prediction model switching condition storage area 17 stores a condition for selecting a prediction model to be used, from among a plurality of prediction models stored in the prediction model storage area 16, at the time of APC execution.

Details of the condition will be described in the following (2).

The analysis unit 20 includes a calculation unit 21, an analysis storage unit 22, and an interface unit (IF unit) 210. The analysis storage unit 22 includes a processing history storage area 23 that stores processing result, light emission data, and device data in past plasma processing, and an analysis result storage area 24 that stores a result of analysis processing.

The input unit 30 is an input device that accepts information input by an operation performed by a user, such as a mouse or a keyboard.

The output unit 31 is an output device that outputs and displays information to a user, such as a display or a printer.

The communication IF unit 32 is an interface which is connected to another apparatus or system such as an existing production management system, via the bus 34, an external network, or the like, and performs information transmission and reception.

The bus 34 connects the processing unit 10, the analysis unit 20, the input unit 30, the output unit 31, and the communication IF unit 32. The IF units 110 and 210 are interfaces that perform information transmission and reception via the bus 34.

The processing result acquisition unit 33 is an interface that acquires the processing result from an inspection device or the like that measures the processing result. The analysis unit 20 may have a form being connected to the plasma processing apparatus including the processing unit 10 via the IF unit 210, as an independent analysis device.

(2) Control Device

An example of processing of prediction and control (APC) performed by the control device 14 will be described with reference to FIGS. 2 to 4.

A prediction model is constructed in advance using the processing history data of the plasma processing in the analysis unit 20 and stored in the prediction model storage area 16 as a prediction model table 16a (see FIG. 3), before executing the APC (S110).

Figures 2, 3:
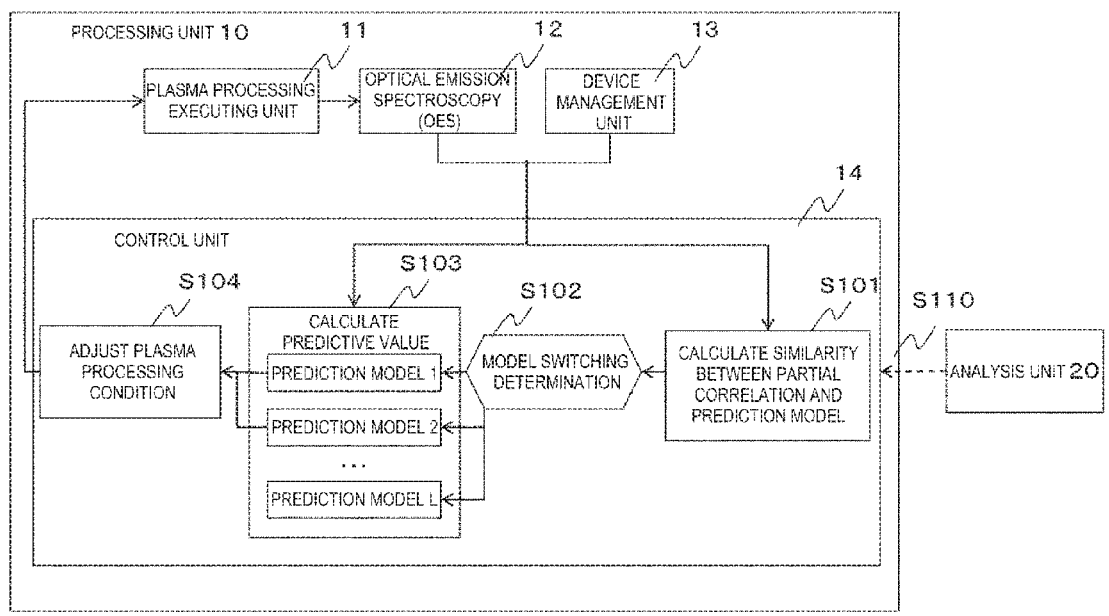
FIG. 2 is a configuration diagram illustrating prediction and control processing.
FIG. 3 is an example of data stored in a prediction model storage area.

As shown in FIG. 3, the prediction model table 16a has a prediction model ID 16b, an explanatory variable 16c of each prediction model, and a calculation formula 16d of the prediction model. Similarly, information necessary for switching the prediction model is determined and stored in the prediction model switching condition storage area 17 as a prediction model switching condition table 17a (see FIG. 4) (S110).

As shown in FIG. 4, a partial correlation is used for switching the prediction model. Switching to the prediction model having a similar partial correlation is performed with respect to the data acquired at the time of APC execution to predict the processing result.

Here, the partial correlation is a correlation excluding an influence of variables other than the variable of interest. For evaluating the partial correlation, for example, a method of estimating the partial correlation between variables from data such as graphical LASSO to be sparse (so that many partial correlations become 0) is used.

The switching monitor variable 17b is a set of variables used when calculating similarity of the partial correlation which is an indicator of model switching. Since the partial correlation is stored for each prediction model, the prediction model ID 17c is stored. Since the partial correlation corresponds to an accuracy matrix (an inverse matrix of a variance-covariance matrix), the accuracy matrix is stored as the partial correlation 17d.

When the plasma processing of the wafer or lot (in this case, the lot) is completed, in a case where setting is made to execute the APC, in the control device 14, the similarity of the partial correlation of data obtained from each prediction model, the optical emission spectroscopy 12, and the device management unit 13 is calculated, based on the switching monitor variable 17b stored in the prediction model switching condition table 17a (S101).

Next, the control device 14 performs model switching determination (S102). In S102, in the prediction model switching condition table 17a, the prediction model ID 17c having the highest similarity of the partial correlation, calculated in S101, is specified as the prediction model used for the prediction of the processing result of the subsequent wafer or lot.

In this manner, the prediction model is switched based on the correlation between monitor data in the last wafer or lot on which the APC is executed. Accordingly, it is possible to switch the prediction model according to the device state at the time of APC execution. In Example, the partial correlation is used for switching the prediction model, but other statistics such as a distance between switching monitor variables 17b may be used.

Next, the control device 14 predicts the processing result by using the specified prediction model, light emission data, and device data (S103). In S103, in the specified prediction model, data of the explanatory variable 16c of the prediction model table 16a is sequentially acquired for each wafer from the optical emission spectroscopy 12 and the device management unit 13 to substitute into the calculation formula 16d, thereby calculating the predictive value of the processing result.

For example, the data acquired for each wafer corresponds to one row in FIG. 7. In a case where the prediction model 1 of the prediction model table 16a is used, since the explanatory variable uses ×3 and ×5, the predictive value of the processing result is a value calculated by substituting ×3 and ×5 of calculation formulas with values of columns ×3 and ×5 of acquired data.

Further, the control device 14 adjusts a plasma processing condition, in accordance with the difference between the predictive value of the processing result and a target value (S104). As the plasma processing condition, for example, a flow rate of plasma processing gas is adjusted. In addition, in S104, not only the plasma processing condition is adjusted, but also in a case where the difference between the target value and the predictive value of the processing result is greater than a predetermined threshold value, a configuration may be made to alert as an abnormality. In addition, a configuration may be made to output the predictive value of the processing result in order to use the predictive value in a device to be used in a step after a step of the plasma processing apparatus 1.

(3) Display of Prediction and Control Processing (APC)

It is necessary for the user to determine whether or not to execute the APC by using the prediction model constructed by the analysis unit 20 using the processing history data and the determined prediction model switching condition. FIG. 5 is an example of an APC setting screen D100 set by a user, and this screen is displayed on the output unit 31 shown in FIG. 1.

The user confirms and inputs the explanatory variable or the calculation formula used for the prediction model in the prediction model D102, and the condition to switch the prediction model in prediction model switching condition D101. After the confirmation and input, in a case of performing only the prediction, instruction is made in D103, and in a case of performing the APC, instruction is made in D104.

FIG. 6 is an example of a display screen showing a prediction and control result, and this screen is displayed on the output unit 31 shown in FIG. 1. An example of the prediction result is D200. In a case where the measured value of the processing result is saved in the analysis storage unit 22, the measured value and the predictive value of the processing result can be displayed together.

In addition, in each wafer or lot, the prediction model used for prediction is displayed. For example, prediction accuracy improves by using different prediction models with respect to the number of processing wafers between a lot having a trend of the processing result downward to the right and a lot having small variation of the processing result, as in D200.

D300 is an example of a result obtained by executing the APC and performing control, and D300 is displayed on the output unit 31 shown in FIG. 1. Here, the measured value of the processing result and the prediction model used for the prediction are displayed. As described above, the prediction accuracy improves by switching the prediction model, as a result, the variation of the processing result after the control can be reduced. The above APC setting is created from the processing history in subsequent analysis processing of the analysis unit 20.

(4) Analysis Unit

The analysis unit 20 performs calculation in the calculation unit 21, by using the processing history data stored in the processing history storage area 23, and saves the analysis result in the analysis result storage area 24.

In the processing history storage area 23, light emission data measured by optical emission spectroscopy 12 during plasma processing, device data managed by device management unit 13, and processing result acquired by the processing result acquisition unit 33 are stored for each wafer that is plasma processed.

FIG. 7 is an example of the processing history data stored in the processing history storage area 23.

The processing history data table 23a has items such as a wafer ID 23b, light emission data 23c, device data 23d, and a processing result 23e. Each column corresponds to the item (variable) of monitoring data, and each row corresponds to a single sheet of the wafer.

Information specifying the processed wafer is stored in the wafer ID 23b. Light emission data, which is obtained by calculating a measurement value of the optical emission spectroscopy 12, is stored in light emission data 23c. The measurement value of the optical emission spectroscopy 12 includes data on time, emission intensity, and wavelength. The value obtained by averaging the emission intensity by the plasma processing time for each wavelength is stored in the light emission data 23c.

The light emission data to be stored may be light emission data acquired during plasma processing for processing the wafer or light emission data acquired during plasma processing (aging processing or cleaning processing) for adjusting the state of the plasma processing unit 11 before and after processing the wafer.

In addition, for each wavelength, the light emission wavelength of a substance (such as Ar or Si) contained in plasma is stored. Further, in a case of using the intensity of light reflected from the wafer or a wall surface, wavelengths having different intensities are stored depending on the state of the wafer and the wall surface. In addition, a ratio of the light emission intensities at a plurality of wavelengths may be used.

Further, the value to be stored is not limited to the average value of the plasma processing time of the emission intensity, and may also be another statistic such as the maximum value or variance. In addition, the value to be stored may also be a value of the light emission intensity at a certain designated time, such as a value of the light emission intensity at an intermediate point of the plasma processing.

The management value or the measurement value of the device management unit 13 at the time of processing each wafer is stored in the device data 23d. Examples thereof include the number of times of plasma processing from cleaning or the waiting time from previous plasma processing. In addition, the device data 23d is not limited to the numerical data, and data such as lot ID is also stored.

The plasma processing result obtained from the processing result acquisition unit 33 is stored in the processing result 23e. In a case where the plasma processing condition is adjusted for each wafer, a change amount of the processing result indicator according to an adjustment amount of the plasma processing condition is calculated using a function between the adjustment amount of the plasma processing condition and the change amount of the processing result, and a value obtained by correcting the measured value of the processing result by the change amount of the processing result may be stored in the processing result 23e.

Figure 8:
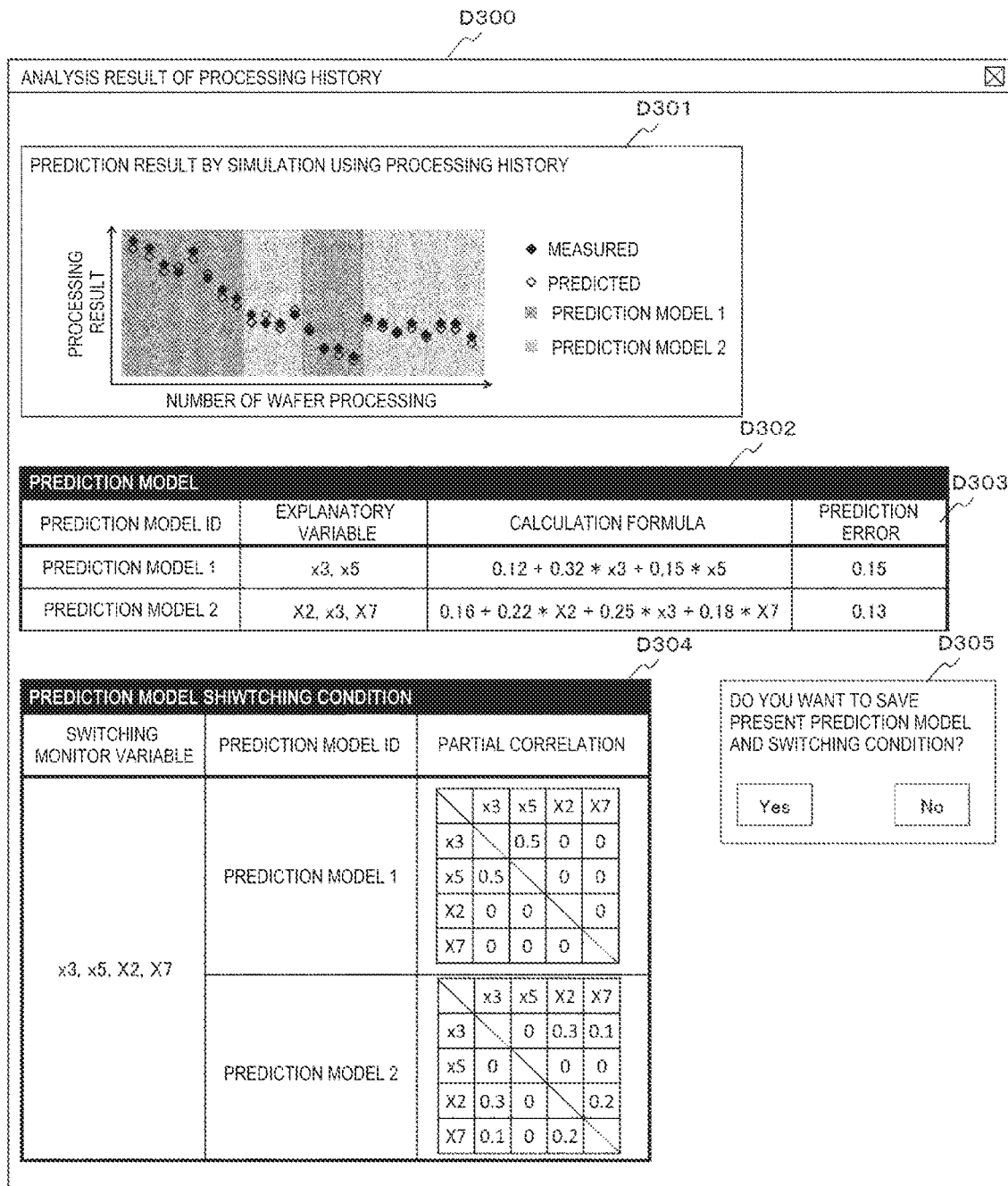
FIG. 8 is a diagram showing an example of a display screen of an analysis result using processing history data of an analysis unit.

FIG. 8 is an example of a display screen D300 showing an analysis result using the processing history data, and this screen is displayed on the output unit 31 shown in FIG. 1. The display screen D300 is displayed after analysis processing of the analysis unit 20 to be described later.

In a prediction model switching condition table D304 and a prediction model table D302, the switching condition of the prediction model determined in the analysis processing of the analysis unit 20 and the constructed prediction model are stored.

A prediction result D301 by simulation using the processing history shows the measured value and the predictive value of the processing result in the processing history data. The prediction model used for prediction for each wafer or lot is also displayed.

A prediction error D303 shows a prediction error (for example, a root mean square error) calculated from the predictive value and the measured value of the processing result.

The user confirms this analysis result and determines in D305 whether to save the constructed prediction model and prediction model switching condition as those to be used for the APC. In case of saving, the prediction model is stored in the prediction model storage area 16 and the prediction model switching condition is stored in the prediction model switching condition storage area 17.

(5) Analysis Processing of Analysis Unit 20

In the analysis processing of the analysis unit 20, the correlation monitor variable used for switching the prediction model that predicts the processing result is specified, and the explanatory variable is strictly selected from multiple pieces of monitor data, and the prediction model is constructed.

Since the prediction model and the condition to switch the prediction model are changed depending on a composition of the film on a wafer surface, which is a target of plasma process, it is necessary to execute the present analysis processing appropriately at the time of starting the plasma processing.

FIG. 9 is an example of the analysis processing using the processing history data stored in the processing history storage area 23, and the flow of analysis processing will be described using the example.

FIG. 10 is an example of a screen D400 designating the input of the analysis processing, and this screen is displayed on the output unit 31 shown in FIG. 1. Before entering the analysis processing, the user designates light emission data D401 and device data D402 to be the input of the analysis processing and instructs execution of the analysis processing (D403).

First, the plural pieces of processing history data are stratified by a lot, and each processing of S202 and S203 is performed for each lot (S201).

Next, a partial correlation between respective variables is evaluated for the processing history data stratified by the lot (S202).

Next, it is considered that as the device state changes, the partial correlation also changes. Therefore, the plural pieces of data are divided so that the change in the partial correlation between variables becomes maximum (S203). It is possible to prepare a model for each state of the device, by dividing data in this manner.

Next, processing from S205 to S208 is performed for each piece of data after division (S204).

First, the partial correlation between the processing result and monitoring data in a lot is evaluated, and a variable of monitoring data having the partial correlation (value of the partial correlation is not estimated to be 0) is selected (S205). Accordingly, the monitoring data directly correlated with the processing result in the lot can be selected as the explanatory variable of the prediction model, and a prediction model that captures the trend of the processing result in the lot can be constructed.

Similarly, the partial correlation between processing result and monitoring data in the lot (in a case of not stratifying by the lot) are evaluated, and a variable of the monitoring data having partial correlation is selected (S206).

Next, a prediction model in which the selected variable of monitoring data is used as the explanatory variable is constructed. In this case, for example, a multivariate regression model that predicts the processing result from a plurality of explanatory variables is constructed by a method such as PLS regression frequently used for process data or LASSO regression having a variable selection function (S207).

Subsequently, in the processing history data, the prediction error is evaluated from the predictive value and the measured value of the processing result calculated by using the constructed prediction model (S208).

Next, the analysis result of the processing history data shown in FIG. 8 is displayed and presented to the user (S209).

Hereinabove, description has been given of Example, but the present invention is not limited to the Example and various modifications can be made in a range not departing from the gist thereof.

For example, in FIG. 11A, a configuration in which the processing result is acquired sequentially from the processing result acquisition unit 33 is adopted.

As shown in FIG. 11A, a configuration in which, the similarity of partial correlation including the processing result with each prediction model is calculated (S105) by using the data of the wafer lastly processed, and the prediction model switching determination (S102) is performed, may also be adopted. When evaluating the partial correlation including the processing result, it is possible to realize model switching more reflecting the device state.

Figure 11B:
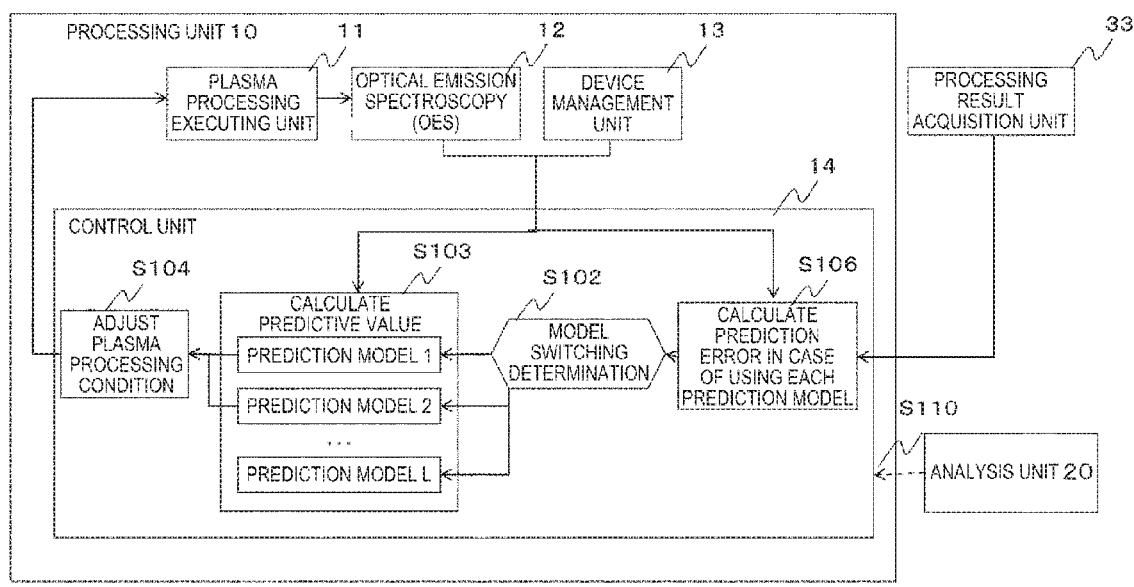
FIG. 11B is a configuration diagram illustrating the prediction and control processing.

In addition, in FIG. 11B, a configuration in which prediction error with each prediction model in the corresponding wafer is calculated by using the processing result acquired subsequently (S106) is adopted.

By using prediction model with a small calculated prediction error, it is possible to select a prediction model with a small prediction error even in prediction of the processing result of the wafer to be subsequently processed.

What is claimed is:

1. A plasma processing apparatus comprising:
    a processing chamber configured to perform plasma processing of a sample;
    a monitor that monitors light emission of plasma;
    a memory storing a plurality of multivariate prediction models each predicting a plasma processing result; and
    a controller configured to
        select one of said plurality of multivariate prediction models having a highest similarity of partial correlation data and a monitor variable based on a partial correlation of an apparatus data, a partial correlation of light emission data of plasma, and a partial correlation of each of said plurality of multivariate prediction models, the apparatus data including data obtained from the processing chamber comprising a parameter specifying a plasma processing condition;
    predict a processing result of plasma processing of a subsequent one or more samples using the selected multivariate prediction model;
    adjust a condition of said plasma processing based on said prediction that uses said selected multivariate prediction model; and
    perform said plasma processing using the adjusted condition.

2. The plasma processing apparatus according to claim 1, wherein the plasma processing apparatus further comprises a prediction analyzer configured to construct at least one of said plurality of multivariate prediction model in which a variable of monitoring data having a partial correlation with the plasma processing result is specified as an explanatory variable.

3. The plasma processing apparatus according to claim 1, wherein
    the controller is configured to correct a value of said parameter, according to a correction amount obtained based on a difference between a predictive value obtained by using the prediction model and a target value.

4. The plasma processing apparatus according to claim 1, wherein the apparatus data includes the number of samples which are plasma processed after wet cleaning.

5. The plasma processing apparatus according to claim 1, further comprising:
    a prediction analyzer configured to construct the prediction model in a which a variable of monitoring data having a partial correlation with the plasma processing result is specified as an explanatory variable.

6. The plasma processing apparatus according to claim 2, wherein
    the explanatory variable includes a wavelength of light emission of plasma and a physical quantity related to the apparatus data, and
    the apparatus data is an indicator of state change of the processing system.

7. The plasma processing apparatus according to claim 2, wherein
    the partial correlation is a partial correlation between the plasma processing result and the variable of the monitoring data, for each lot that is a unit of the plasma processing.

8. A plasma processing apparatus comprising:
    a processing chamber configured to perform plasma processing of a sample;
    a monitor that monitors light emission of plasma;
    a memory storing a plurality of multivariate prediction models each predicting a plasma processing result; and
    a controller configured to
        select one of said plurality of multivariate prediction models having a highest similarity of partial correlation data and a monitor variable based on statistics of an apparatus data, statistics of light emission data, and statistics of said one selected multivariate prediction model, the apparatus data including data obtained from the processing chamber comprising a parameter specifying a plasma processing condition;
    predict a processing result of plasma processing of a subsequent one or more samples using the selected multivariate prediction model;
    adjust a condition of said plasma processing based on said prediction that uses said selected multivariate prediction model; and
    perform said plasma processing using the adjusted condition.

* * * * *